(12) United States Patent
Yang

(10) Patent No.: US 9,150,406 B2
(45) Date of Patent: Oct. 6, 2015

(54) MULTI-AXIS INTEGRATED MEMS DEVICES WITH CMOS CIRCUITS AND METHOD THEREFOR

(71) Applicant: mCube Inc., San Jose, CA (US)

(72) Inventor: Xiao (Charles) Yang, San Jose, CA (US)

(73) Assignee: mCube Inc., San Jose, CA (US)

( * ) Notice: Subject to any disclaimer, the term of this patent is extended or adjusted under 35 U.S.C. 154(b) by 0 days.

(21) Appl. No.: 14/084,415

(22) Filed: Nov. 19, 2013

(65) Prior Publication Data

US 2014/0162393 A1    Jun. 12, 2014

Related U.S. Application Data

(62) Division of application No. 12/983,309, filed on Jan. 2, 2011, now Pat. No. 8,637,943.

(60) Provisional application No. 61/292,141, filed on Jan. 4, 2010.

(51) Int. Cl.
| | |
|---|---|
| *H01L 21/00* | (2006.01) |
| *B81C 1/00* | (2006.01) |
| *H01L 27/146* | (2006.01) |
| *B81B 7/02* | (2006.01) |
| *H01L 27/06* | (2006.01) |

(52) U.S. Cl.
CPC .............. *B81C 1/0023* (2013.01); *B81B 7/02* (2013.01); *B81C 1/00246* (2013.01); *H01L 27/14603* (2013.01); *B81C 2203/0771* (2013.01); *H01L 27/0688* (2013.01)

(58) Field of Classification Search
CPC ............ H01L 43/08; H01L 2924/1461; H01L 41/1132; H01L 21/56; H01L 21/563
See application file for complete search history.

(56) References Cited

U.S. PATENT DOCUMENTS

| | | | |
|---|---|---|---|
| 3,614,677 | A | 10/1971 | Wilfinger |
| 4,954,698 | A | 9/1990 | Yasunaga et al. |
| 5,140,745 | A | 8/1992 | McKenzie |
| 5,157,841 | A | 10/1992 | Dinsmore |

(Continued)

OTHER PUBLICATIONS

U.S. Appl. No. 12/983,309, Non Final Office Action mailed Nov. 27, 2012, 12 pages.

(Continued)

*Primary Examiner* — David Vu
*Assistant Examiner* — Cuong Nguyen
(74) *Attorney, Agent, or Firm* — Kilpatrick Townsend and Stockton LLP

(57) ABSTRACT

An integrated multi-axis mechanical device and integrated circuit system. The integrated system can include a silicon substrate layer, a CMOS device region, four or more mechanical devices, and a wafer level packaging (WLP) layer. The CMOS layer can form an interface region, on which any number of CMOS and mechanical devices can be configured. The mechanical devices can include MEMS devices configured for multiple axes or for at least a first direction. The CMOS layer can be deposited on the silicon substrate and can include any number of metal layers and can be provided on any type of design rule. The integrated MEMS devices can include, but not exclusively, any combination of the following types of sensors: magnetic, pressure, humidity, temperature, chemical, biological, or inertial. Furthermore, the overlying WLP layer can be configured to hermetically seal any number of these integrated devices.

6 Claims, 14 Drawing Sheets

(56) References Cited

U.S. PATENT DOCUMENTS

| | | |
|---|---|---|
| 5,173,597 A | 12/1992 | Anglin |
| 5,493,769 A | 2/1996 | Sakai et al. |
| 5,668,033 A | 9/1997 | Ohara et al. |
| 6,046,409 A | 4/2000 | Ishii et al. |
| 6,076,731 A | 6/2000 | Terrell |
| 6,188,322 B1 | 2/2001 | Yao et al. |
| 6,278,178 B1 | 8/2001 | Kwon et al. |
| 6,483,172 B1 | 11/2002 | Cote et al. |
| 6,534,726 B1 | 3/2003 | Okada et al. |
| 6,656,604 B2 | 12/2003 | Hasewaga |
| 6,855,572 B2 | 2/2005 | Jeung et al. |
| 6,979,872 B2 | 12/2005 | Borwick et al. |
| 7,145,555 B2 | 12/2006 | Taylor et al. |
| 7,183,630 B1 | 2/2007 | Fogelson et al. |
| 7,195,945 B1 | 3/2007 | Edelstein et al. |
| 7,258,009 B2 | 8/2007 | Imai |
| 7,358,724 B2 | 4/2008 | Taylor et al. |
| 7,511,379 B1 | 3/2009 | Flint |
| 7,514,760 B1 | 4/2009 | Quevy |
| 7,599,277 B1 | 10/2009 | Kato et al. |
| 7,612,443 B1 | 11/2009 | Bernstein et al. |
| 7,671,478 B2 | 3/2010 | Wathanawasam et al. |
| 7,708,189 B1 | 5/2010 | Cipriano |
| 7,713,785 B1 | 5/2010 | Flint |
| 7,861,422 B2 | 1/2011 | MacDonald |
| 8,140,358 B1 | 3/2012 | Ling et al. |
| 8,148,808 B2 * | 4/2012 | Braden et al. ................ 257/687 |
| 8,165,323 B2 | 4/2012 | Zhou |
| 8,181,874 B1 | 5/2012 | Wang et al. |
| 8,236,577 B1 | 8/2012 | Hsu et al. |
| 8,250,921 B2 | 8/2012 | Nasiri et al. |
| 8,259,311 B2 | 9/2012 | Petschko et al. |
| 2001/0053565 A1 | 12/2001 | Khoury |
| 2002/0072163 A1 | 6/2002 | Wong et al. |
| 2002/0134837 A1 | 9/2002 | Kishon |
| 2003/0133489 A1 | 7/2003 | Hirota et al. |
| 2004/0002808 A1 | 1/2004 | Hashimoto et al. |
| 2004/0016995 A1 | 1/2004 | Kuo et al. |
| 2004/0063325 A1 | 4/2004 | Urano et al. |
| 2004/0104268 A1 | 6/2004 | Bailey |
| 2004/0113246 A1 | 6/2004 | Boon |
| 2004/0207035 A1 | 10/2004 | Witcraft et al. |
| 2004/0227201 A1 | 11/2004 | Borwick, III et al. |
| 2005/0074147 A1 | 4/2005 | Smith et al. |
| 2005/0174338 A1 | 8/2005 | Ing et al. |
| 2005/0199791 A1 | 9/2005 | Sengoku et al. |
| 2005/0247787 A1 | 11/2005 | Von Mueller et al. |
| 2005/0252293 A1 | 11/2005 | Wong et al. |
| 2006/0049826 A1 | 3/2006 | Daneman et al. |
| 2006/0081954 A1 | 4/2006 | Tondra et al. |
| 2006/0141786 A1 | 6/2006 | Boezen et al. |
| 2006/0168832 A1 | 8/2006 | Yasui et al. |
| 2006/0211044 A1 | 9/2006 | Green |
| 2006/0274399 A1 | 12/2006 | Yang |
| 2007/0046239 A1 | 3/2007 | Hashizume |
| 2007/0132733 A1 | 6/2007 | Ram |
| 2007/0181962 A1 | 8/2007 | Partridge et al. |
| 2007/0200564 A1 | 8/2007 | Motz et al. |
| 2007/0281379 A1 | 12/2007 | Stark |
| 2007/0281387 A1 * | 12/2007 | Lutz et al. ................ 438/106 |
| 2008/0014682 A1 | 1/2008 | Yang et al. |
| 2008/0066547 A1 | 3/2008 | Tanaka et al. |
| 2008/0110259 A1 | 5/2008 | Takeno |
| 2008/0123242 A1 | 5/2008 | Zhou |
| 2008/0210007 A1 | 9/2008 | Yamaji et al. |
| 2008/0211113 A1 | 9/2008 | Chua et al. |
| 2008/0211450 A1 | 9/2008 | Yamada et al. |
| 2008/0277747 A1 | 11/2008 | Ahmad |
| 2009/0015251 A1 | 1/2009 | Azumi et al. |
| 2009/0049911 A1 | 2/2009 | Fukuda |
| 2009/0115412 A1 | 5/2009 | Fuse |
| 2009/0262074 A1 | 10/2009 | Nasiri et al. |
| 2009/0307557 A1 | 12/2009 | Rao et al. |
| 2009/0321510 A1 | 12/2009 | Day et al. |
| 2010/0045282 A1 | 2/2010 | Shibasaki et al. |
| 2010/0075481 A1 | 3/2010 | Yang |
| 2010/0083756 A1 | 4/2010 | Merz et al. |
| 2010/0095769 A1 | 4/2010 | Matsumoto et al. |
| 2010/0109102 A1 * | 5/2010 | Chen et al. ................ 257/417 |
| 2010/0171570 A1 | 7/2010 | Chandrahalim |
| 2010/0236327 A1 | 9/2010 | Mao |
| 2010/0248662 A1 | 9/2010 | Sheynblat et al. |
| 2010/0257933 A1 * | 10/2010 | Verjus et al. ................ 73/504.04 |
| 2010/0260388 A1 | 10/2010 | Garret et al. |
| 2010/0302199 A1 | 12/2010 | Taylor et al. |
| 2010/0307016 A1 | 12/2010 | Mayor et al. |
| 2010/0312519 A1 | 12/2010 | Huang et al. |
| 2011/0101475 A1 * | 5/2011 | Parpia et al. ................ 257/417 |
| 2011/0131825 A1 | 6/2011 | Mayor et al. |
| 2011/0146401 A1 | 6/2011 | Inaguma et al. |
| 2011/0154905 A1 | 6/2011 | Hsu |
| 2011/0172918 A1 | 7/2011 | Tome |
| 2011/0183456 A1 | 7/2011 | Hsieh et al. |
| 2011/0198395 A1 | 8/2011 | Chen |
| 2011/0265574 A1 | 11/2011 | Yang |
| 2011/0266340 A9 | 11/2011 | Block et al. |
| 2012/0007597 A1 | 1/2012 | Seeger et al. |
| 2012/0007598 A1 | 1/2012 | Lo et al. |
| 2012/0215475 A1 | 8/2012 | Rutledge et al. |

OTHER PUBLICATIONS

U.S. Appl. No. 12/983,309, Final Office Action mailed Apr. 25, 2013, 15 pages.

U.S. Appl. No. 12/983,309, Notice of Allowance mailed Aug. 13, 2013, 11 pages.

* cited by examiner

MULTI-AXIS INTEGRATED MEMS DEVICES WITH CMOS CIRCUITS AND METHOD THEREFOR

CROSS-REFERENCES TO RELATED APPLICATIONS

The present application is a divisional application of U.S. patent application Ser. No. 12/983,309, filed Jan. 2, 2011, which claims priority to Provisional Patent Application No. 61/292,141, filed Jan. 4, 2010, both of which are incorporated herein by reference for all purposes. The present invention also incorporates by reference, for all purposes, the following pending patent applications related to sensor and MEMS devices: U.S. patent application Ser. No. 12/913,440, filed Oct. 29, 2010, U.S. patent application Ser. No. 12/859,631, filed Aug. 19, 2010, U.S. patent application No. 61/356,467, filed Jun. 18, 2010, U.S. patent application Ser. No. 12/859,672, filed Aug. 19, 2010, and U.S. patent application Ser. No. 12/859,647, filed Aug. 19, 2010.

BACKGROUND OF THE INVENTION

Embodiments of the present invention relates generally to integrated devices. More particularly, embodiments of the present invention provide a system and method for integrating at least two different micro electro mechanical systems (MEMS) devices with one or more complementary metal oxide semiconductor (CMOS) devices, but can be others. Merely by way of example, the MEMS devices can include an accelerometer, a gyroscope, a magnetic field sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to various embodiments of the present invention, techniques related generally to integrated devices are provided. More particularly, the embodiments of the present invention provides a system and method for integrating at least two different micro electro mechanical systems (MEMS) devices with one or more complementary metal oxide semiconductor (CMOS) devices, but can be others. Merely by way of example, the MEMS devices can include at least an accelerometer, a gyroscope, a magnetic field sensor, a pressure sensor, a microphone, a humidity sensor, a temperature sensor, a chemical sensor, a biosensor, an inertial sensor, and others. But it will be recognized that the invention has a much broader range of applicability.

In an embodiment, the present invention provides an integrated multi-axis mechanical device and integrated circuit system. The system includes a semiconductor substrate and a CMOS integrated circuit device region formed overlying the semiconductor substrate. The system also includes an interface region overlying the CMOS integrated circuit device region. The system can have one or more regions overlying the interface region and configured for at least four different mechanical devices. In a specific embodiment, the mechanical devices may includes a gyroscope device comprising at least a first axis, a second axis, and a third axis, an accelerometer device comprising at least a first axis, a second axis, and a third axis, a magnetic field sensing device comprising at least a first axis, a second axis, and a third axis, and a pressure sensor device configured to detect a force in at least a first direction.

In various embodiments, the present invention provides an integrated system including a substrate layer, a semiconductor layer, integrated devices, and an encapsulation layer. In a specific embodiment, each of the devices is integrated with the semiconductor layer and is covered by the encapsulation layer. The semiconductor layer forms an interface region, on which CMOS and MEMS devices can be configured. Of course, there can be other variations, modifications, and alternatives.

Many benefits are achieved by way of the one or more embodiments of the present invention over conventional techniques. For example, the present technique provides an easy to use process that relies upon conventional technology. In some embodiments, the method provides higher device yields in dies per wafer with the integrated approach. Also, the method provides a process and system that are compatible with conventional process technology without substantial modifications to conventional equipment and processes. This technique can reduce off-chip connections, which makes the mass production of smaller and thinner units possible. Additionally, integrated CMOS-MEMS technology can achieve high accuracy through the minimization of parasitic resistances and capacitances due to joint fabrication. Preferably, the invention provides for an improved integrated CMOS-MEMS device system and related applications for a variety of uses. Additionally, direct integration of CMOS and MEMS is especially desirable for systems implementing arrayed microsensors and microactuators on a single chip. This method can reduce off-chip connections, which makes the mass production of smaller and thinner units possible. Additionally, integrated CMOS-MEMS technology can achieve high accuracy through the minimization of parasitic resistances and capacitances due to joint fabrication.

Depending upon the embodiment, one or more of these benefits may be achieved. These and other benefits will be described in more throughout the present specification and more particularly below.

Various additional objects, features and advantages of the one or more embodiments of the present invention can be more fully appreciated with reference to the detailed description and accompanying drawings that follow.

DETAILED DESCRIPTION OF THE INVENTION

According to the present invention, techniques related generally to integrated devices and systems are provided. More particularly, embodiments of the present invention provide a system and method for integrating MEMS devices with other system applications configured on at least CMOS integrated circuit devices. Merely by way of example, the MEMS devices can include at least an accelerometer, a gyroscope, a magnetic field sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
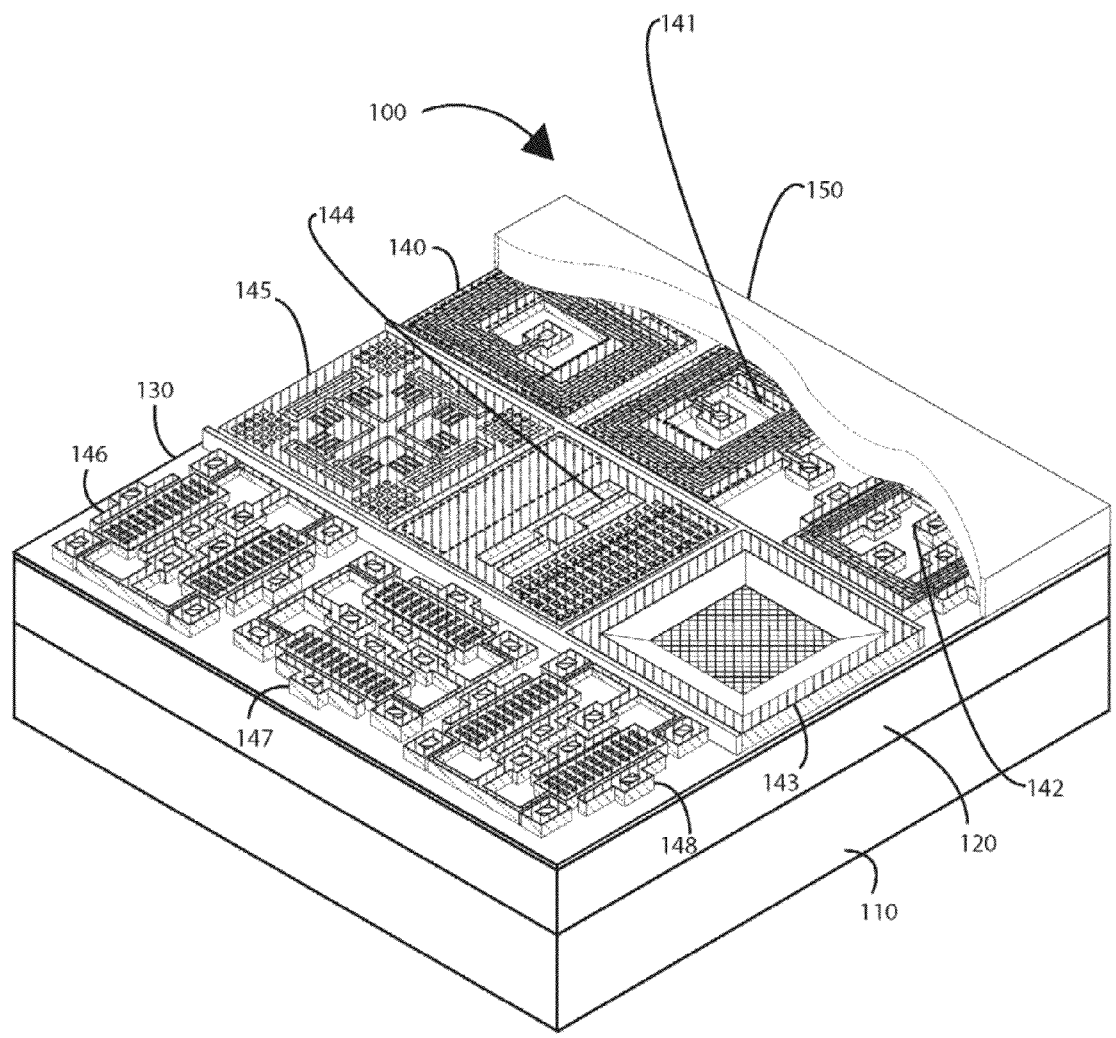
FIG. 1 is a simplified perspective diagram of an integrated multi-axial mechanical device and integrated circuit system according to an embodiment of the present invention.

FIG. 1 is a simplified perspective diagram of an integrated multi-axial mechanical device and integrated circuit system according to an embodiment of the present invention. This diagram is merely an example, which should not unduly limit the scope of the claims herein. One of ordinary skill in the art would recognize other variations, modifications, and alternatives. As shown, the system 100 includes a substrate layer 110, a CMOS device region 120, an interface region 130 overlying the device region 120, one or more regions overlying the interface region 130 that are configured for at least four different mechanical devices, and an encapsulation layer 150. Of course, there can be other variations, modifications, and alternatives.

In specific embodiment, the mechanical devices can include a gyroscope device, an accelerometer device, a magnetic field sensing device, and a pressure sensor device 143. In an embodiment, the magnetic sensing device can include a first axis sensing device 140, a second axis sensing device 141, and a third axis sensing device 142. In various embodiments, the first axis of the sensing device can represent an x-axis, the second axis can represent a y-axis, and the third can represent a z-axis. In various embodiments, the gyroscope device can include a first axis gyroscope device 146, a second axis gyroscope device 147, and a third axis gyroscope device 148. In a specific embodiment, the first axis of the gyroscope device can represent an x-axis, the second axis can represent a y-axis, and the third can represent a z-axis. The accelerometer device can include a first and second axis accelerometer device 145, and a third axis accelerometer device 144. The third axis of the accelerometer device can represent the z-axis, and the first and second axis can represent axes in the x and y direction, respectively. Also, the pressure sensor device 143 can be configured to detect a force in at least a first direction. One of ordinary skill in the art will recognize other modifications, variations, and alternatives.

These mechanical devices are integrated with the CMOS device region 120 on top of the common substrate layer 110 and are covered by the encapsulation layer 150. In an embodiment, the common semiconductor layer 120 can be made of a silicon material or any other appropriate semiconductor. The semiconductor layer 120 can include a CMOS layer or any other appropriate layer for implementing microelectronics. The CMOS layer 120 includes a surface region which forms an interface region 130, on which the devices 140-148 can be configured. In a specific embodiment, devices 140-148 can be formed from a common material layer, a common processed material layer, mask layer, or other layers or combinations thereof. In various embodiments, devices 140-148 can be configured in an array within a vicinity of each other to reduce parasitics. Again, there can be other variations, modifications, and alternatives. Further details of various integration techniques of the component layers and devices are provided below.

In various embodiments, the mechanical devices 140-148 can include any combination of MEMS devices. These can include accelerometers, gyroscopes, microphones, sensors, and others. Though not exclusively, the sensors can by any of the following types: magnetic, pressure, humidity, temperature, chemical, biological, or inertial. In further embodiments, any number of MEMS devices can be included in the integrated system 100, and each of these devices can comprise one or more deposited materials, one or more bonded materials, or others. Of course, there can be other variations, modifications, and alternatives.

In various embodiments, the CMOS device region 120 can include a CMOS layer comprised of any number of metal layers and can be provided on any type of design rule, such as a 0.18 micron design rule (or 0.11 micron or 90 nm or 70 nm or 55 nm) or less. Also, the interface region 130 formed by the semiconductor layer can be integrated with any number of CMOS devices, which can be configured from a foundry compatible process, such as those of semiconductor foundry operations of Taiwan Semiconductor Manufacturing Corporation, and others. The devices 140-148, and possibly additional devices, can all be configured individually in separate portions of the interface region 130. In further embodiments, the MEMS devices 140-143, and additional devices, and comprise an upper surface region that faces away from the CMOS layer 120 and devices. One skilled in the art would recognize other variations, modifications, and alternatives.

In various embodiments, the overlying encapsulation layer 150 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 150 can be configured to hermetically seal any number of the integrated devices on the interface region 130. In various embodiments, encapsulation layer 150 can be used to form a first package. The first package can be electrically coupled to a processor, which can be electrically coupled to a memory and display. The processor can be configured to execute executable instructions from the memory, and the processor can be configured to receive signals from the devices 140-148, or other devices, in response to physical perturbations. Also, the processor can be configured to perform one or more tasks in response to the signals from devices 140-148 and/or other devices. In a specific embodiment, the first package, the processor, the memory, and the display can be disposed into a physical case. Again, there can be many other variations, modifications, and alternatives.

The present technique provides an easy to use process that relies upon conventional technology. This technique can reduce off-chip connections, which makes the mass production of smaller and thinner units possible. Also, integrated CMOS-MEMS technology can achieve high accuracy through the minimization of parasitic resistances and capacitances due to joint fabrication. In some embodiments, the method provides higher device yields in dies per wafer with the integrated approach. Additionally, the method provides a process and system that are compatible with conventional process technology without substantial modifications to conventional equipment and processes.

It is also understood that the examples and embodiments described herein are for illustrative purposes only and that various modifications or changes in light thereof will be suggested to persons skilled in the art and are to be included within the spirit and purview of this application and scope of the appended claims. Further details of the integration of CMOS and MEMS devices can be found throughout the present specification and more particularly below.

Figure 2:
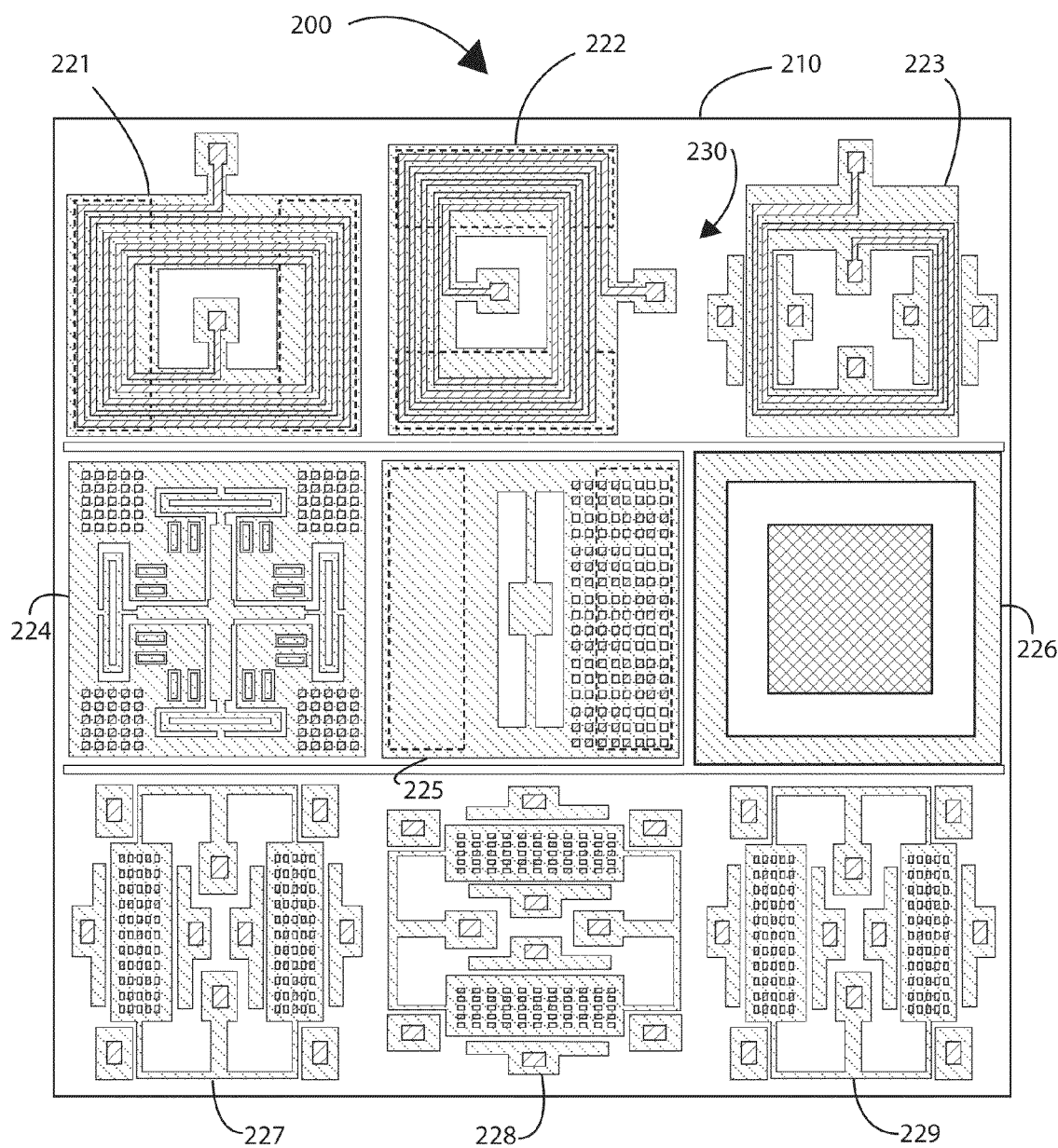
FIG. 2 is a simplified top diagram of an integrated multi-axial mechanical device and integrated circuit system according to an embodiment of the present invention.

FIG. 2 is a simplified top diagram of an integrated multi-axial mechanical device and integrated circuit system according to an embodiment of the present invention. This diagram is merely an example, which should not unduly limit the scope of the claims herein. One of ordinary skill in the art would recognize other variations, modifications, and alternatives. As shown, the system 200 includes a CMOS device region 210, devices 221-229, and an interface region 230. Of course, there can be other variations, modifications, and alternatives. In an embodiment, each of the devices 221-229 can include a mechanical device. In a specific embodiment, the each of the devices 221-229 can include a MEMS device; FIG. 2 depicts the integrated system 200 as having an accelerometer device, a gyroscope device, a magnetic field sensing device, and a pressure sensor device 226. These devices are integrated with the CMOS device region 210. In an embodiment, the device region 210 can be made of a silicon material or any other appropriate semiconductor. The device region 210 can include a CMOS layer or any other appropriate layer for implementing microelectronics. The CMOS layer 210 includes a surface region which forms an interface region 230, on which the devices 221-229 can be configured. The interface region 230 can be configured into one or more regions for the devices 221-229. One of ordinary skill in the art will recognize other variations, modifications, and alternatives.

In various embodiments, the magnetic field sensing device can include a first axis sensing device 221, a second axis sensing device 222, and a third axis sensing device 223. In a specific embodiment, the first axis of the sensing device can represent an x-axis, the second axis can represent a y-axis, and the third can represent a z-axis. The gyroscope device can include a first axis gyroscope device 227, a second axis gyroscope device 228, and a third axis gyroscope device 229. The first axis of the gyroscope device can represent an x-axis, the second axis can represent a y-axis, and the third can represent a z-axis. In various embodiments, the accelerometer device can include a first and second axis accelerometer device 224, and a third axis accelerometer device 225. In a specific embodiment, the third axis of the accelerometer device can represent the z-axis, and the first and second axis can represent axes in the x and y direction, respectively. Also, the pressure sensor device 226 can be configured to detect a force in at least a first direction. Of course, there can be other modifications, variations, and alternatives In various embodiments, the devices 221-229 can include any combination of MEMS devices. These can include accelerometers, gyroscopes, microphones, sensors, and others. Though not exclusively, the sensors can by any of the following types: magnetic, pressure, humidity, temperature, chemical, biological, or inertial. In further embodiments, any number of MEMS devices can be included in the integrated system 200, and each of these devices can comprise one or more deposited materials, one or more bonded materials, or others. Of course, there can be other variations, modifications, and alternatives.

In various embodiments, the semiconductor layer 210 can include a CMOS layer comprised of any number of metal layers and can be provided on any type of design rule, such as a 0.18 micron design rule or less. Also, the interface region 230 formed by the semiconductor layer can be integrated with any number of CMOS devices, which can be configured from a foundry compatible process. The devices 220-223, and possibly additional devices, can all be configured individually in separate portions of the interface region 230. In further embodiments, the MEMS devices 220-223, and additional devices, and comprise an upper surface region that faces away from the CMOS layer 210 and devices. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
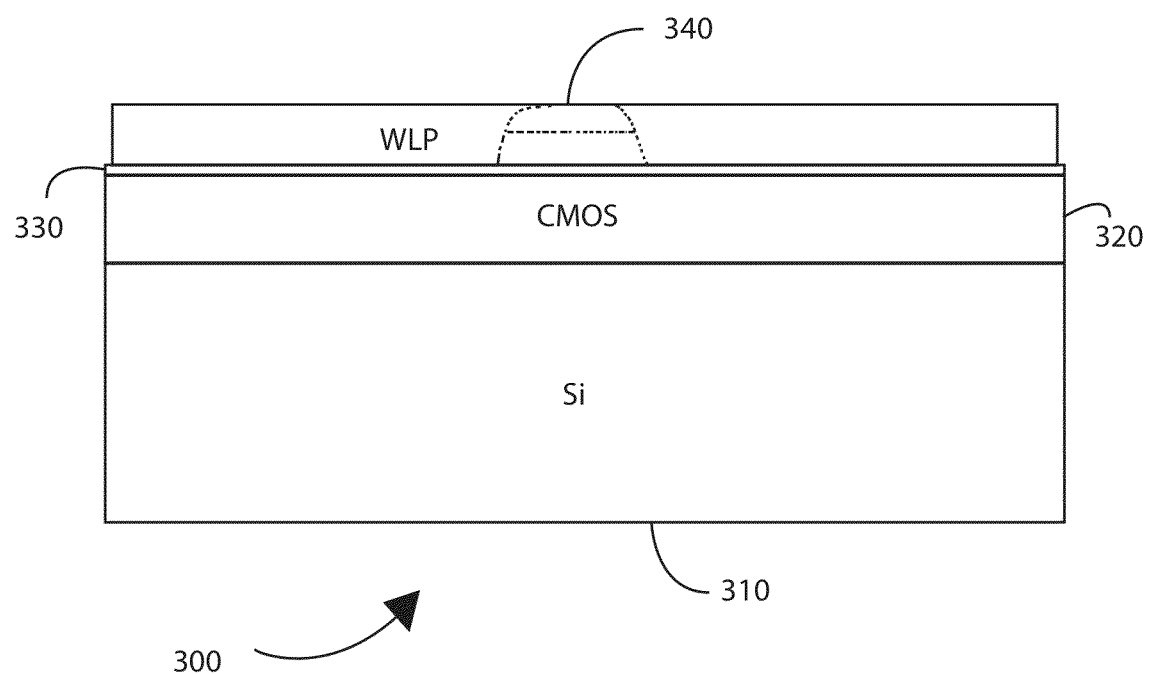
FIG. 3 is a simplified side diagram of an integrated multi-axial mechanical device and integrated circuit system according to an embodiment of the present invention.

FIG. 3 is a simplified side diagram of an integrated multi-axial mechanical device and integrated circuit system according to an embodiment of the present invention. This diagram is merely an example, which should not unduly limit the scope of the claims herein. One of ordinary skill in the art would recognize other variations, modifications, and alternatives. As shown, the system 300 includes a substrate layer 310, a semiconductor layer 320, and an encapsulation layer 340. The semiconductor layer 320 covers the substrate layer 310 while also creating a surface region that forms an interface region 330. In an embodiment, the common semiconductor layer 320 can be made of a silicon material or any other appropriate semiconductor. The semiconductor layer 320 can include a CMOS layer or any other appropriate layer for implementing microelectronics.

In various embodiments, the semiconductor layer 320 can include a CMOS layer comprised of any number of metal layers and can be provided on any type of design rule, such as a 0.18 micron design rule or less. Also, the interface region 330 formed by the semiconductor layer can be integrated with any number of MEMS devices and CMOS devices; the CMOS devices can be configured from a foundry compatible process. The CMOS and MEMS devices can all be configured individually in separate portions of the interface region 330. One skilled in the art would recognize other variations, modifications, and alternatives.

In various embodiments, the overlying encapsulation layer 340 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 340 can be configured to hermetically seal any number of the integrated devices on the interface region 330. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
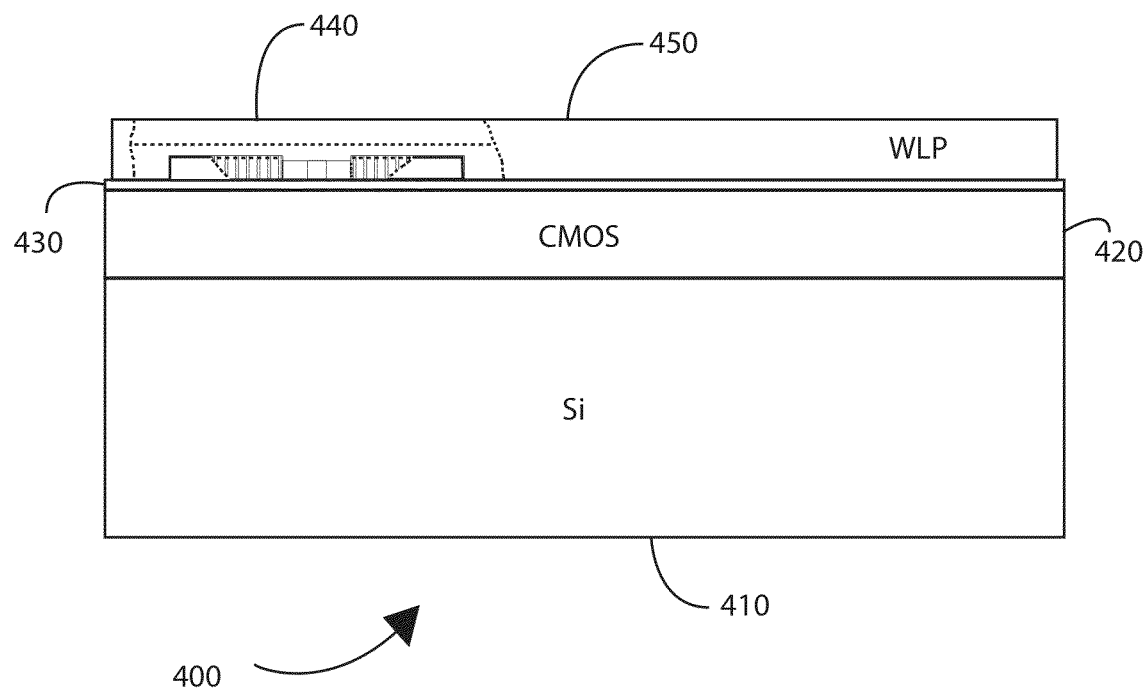
FIG. 4 is a simplified side diagram of an integrated multi-axial mechanical device and integrated circuit system according to an embodiment of the present invention.

FIG. 4 is a simplified side diagram of an integrated multi-axial mechanical device and integrated circuit system according to another embodiment of the present invention. This diagram is merely an example, which should not unduly limit the scope of the claims herein. One of ordinary skill in the art would recognize other variations, modifications, and alternatives. As shown, the system 400 includes a substrate layer 410, a semiconductor layer 420, an integrated device 440, and an encapsulation layer 450. The semiconductor layer 420 covers the substrate layer 410 while also creating a surface region that forms an interface region 430. In an embodiment, the common semiconductor layer 420 can be made of a silicon material or any other appropriate semiconductor. The semiconductor layer 420 can include a CMOS layer or any other appropriate layer for implementing microelectronics.

In various embodiments, the semiconductor layer 420 can include a CMOS layer comprised of any number of metal layers and can be provided on any type of design rule, such as a 0.18 micron design rule or less. Also, the interface region 430 formed by the semiconductor layer can be integrated with any number of MEMS devices and CMOS devices; the CMOS devices can be configured from a foundry compatible process. The CMOS and MEMS devices can all be configured individually in separate portions of the interface region 430. One skilled in the art would recognize other variations, modifications, and alternatives.

In a specific embodiment, the integrated device 440 can be an accelerometer. In further embodiments, any number of MEMS devices can be included in the integrated system 400, and each of these devices can comprise one or more deposited materials, one or more bonded materials, or others. Of course, there can be other variations, modifications, and alternatives.

In various embodiments, the overlying encapsulation layer 450 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 450 can be configured to hermetically seal any number of the integrated devices on the interface region 430. In various embodiments, encapsulation layer 150 can be used to form a first package. The first package can be electrically coupled to a processor, which can be electrically coupled to a memory and display. The processor can be configured to execute executable instructions from the memory, and the processor can be configured to receive signals from the device 440, or other devices, in response to physical perturbations. Also, the processor can be configured to perform one or more tasks in response to the signals from devices 440 and/or other devices. In a specific embodiment, the first package, the processor, the memory, and the display can be disposed into a physical case. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
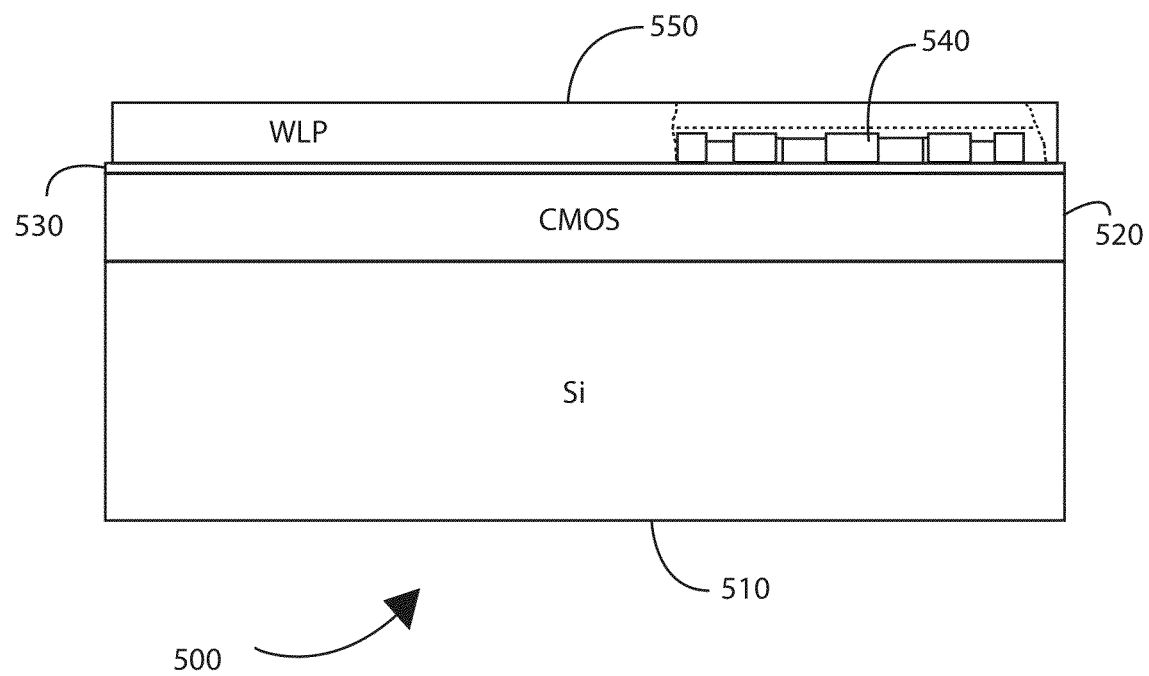
FIG. 5 is a simplified side diagram of an integrated multi-axial mechanical device and integrated circuit system according to an embodiment of the present invention.

FIG. 5 is a simplified side diagram of an integrated multi-axial mechanical device and integrated circuit system according to yet another embodiment of the present invention. This diagram is merely an example, which should not unduly limit the scope of the claims herein. One of ordinary skill in the art would recognize other variations, modifications, and alternatives. As shown, the system 500 includes a substrate layer 510, a semiconductor layer 520, an integrated device 540, and an encapsulation layer 550. The semiconductor layer 520 covers the substrate layer 510 while also creating a surface region that forms an interface region 530. In an embodiment, the common semiconductor layer 520 can be made of a silicon material or any other appropriate semiconductor. The semiconductor layer 520 can include a CMOS layer or any other appropriate layer for implementing microelectronics.

In various embodiments, the semiconductor layer 520 can include a CMOS layer comprised of any number of metal layers and can be provided on any type of design rule, such as a 0.18 micron design rule or less. Also, the interface region 530 formed by the semiconductor layer can be integrated with any number of MEMS devices and CMOS devices; the CMOS devices can be configured from a foundry compatible process. The CMOS and MEMS devices can all be configured individually in separate portions of the interface region 530. One skilled in the art would recognize other variations, modifications, and alternatives.

In a specific embodiment, the integrated device 540 can be a gyroscope. In further embodiments, any number of MEMS devices can be included in the integrated system 500, and each of these devices can comprise one or more deposited materials, one or more bonded materials, or others. Of course, there can be other variations, modifications, and alternatives.

In various embodiments, the overlying encapsulation layer 550 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 550 can be configured to hermetically seal any number of the integrated devices on the interface region 530. In various embodiments, encapsulation layer 150 can be used to form a first package. The first package can be electrically coupled to a processor, which can be electrically coupled to a memory and display. The processor can be configured to execute executable instructions from the memory, and the processor can be configured to receive signals from device 540, or other devices, in response to physical perturbations. Also, the processor can be configured to perform one or more tasks in response to the signals from device 540 and/or other devices. In a specific embodiment, the first package, the processor, the memory, and the display can be disposed into a physical case. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
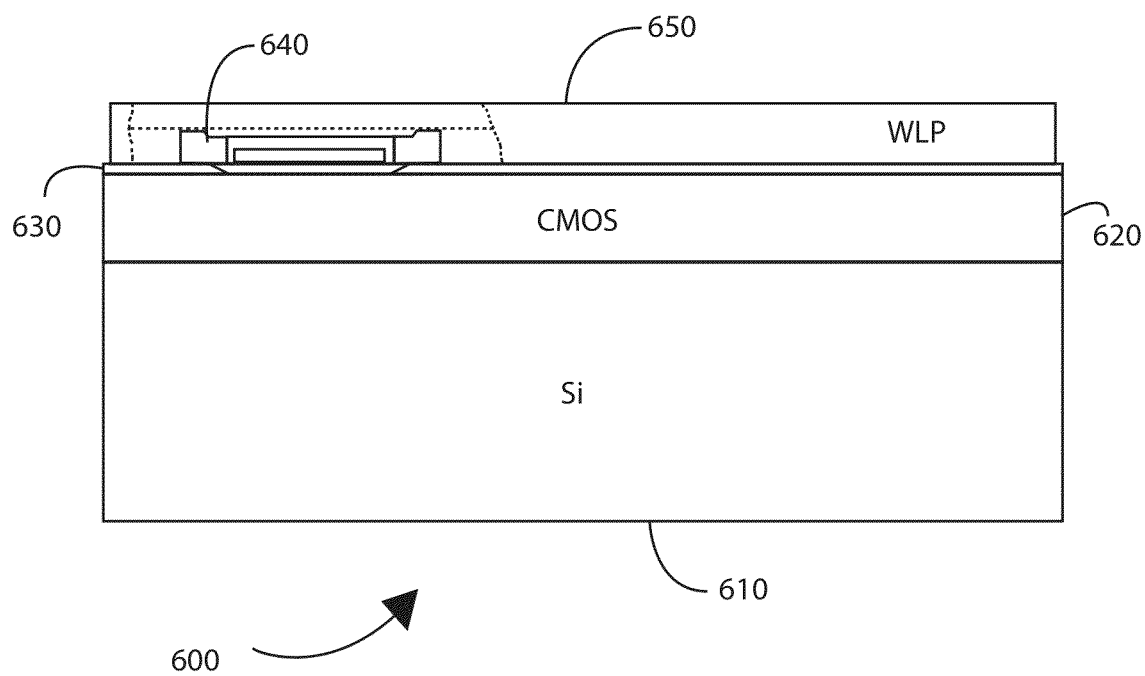
FIG. 6 is a simplified side diagram of an integrated multi-axial mechanical device and integrated circuit system according to an embodiment of the present invention.

FIG. 6 is a simplified side diagram of an integrated multiaxial mechanical device and integrated circuit system according to yet another embodiment of the present invention. This diagram is merely an example, which should not unduly limit the scope of the claims herein. One of ordinary skill in the art would recognize other variations, modifications, and alternatives. As shown, the system 600 includes a substrate layer 610, a semiconductor layer 620, an integrated device 640, and an encapsulation layer 650. The semiconductor layer 620 covers the substrate layer 610 while also creating a surface region that forms an interface region 630. In an embodiment, the common semiconductor layer 620 can be made of a silicon material or any other appropriate semiconductor. The semiconductor layer 620 can include a CMOS layer or any other appropriate layer for implementing microelectronics.

In various embodiments, the semiconductor layer 620 can include a CMOS layer comprised of any number of metal layers and can be provided on any type of design rule, such as a 0.18 micron design rule or less. Also, the interface region 630 formed by the semiconductor layer can be integrated with any number of MEMS devices and CMOS devices; the CMOS devices can be configured from a foundry compatible process. The CMOS and MEMS devices can all be configured individually in separate portions of the interface region 630. One skilled in the art would recognize other variations, modifications, and alternatives.

In a specific embodiment, the integrated device 640 can be a magnetic field sensor. In further embodiments, any number of MEMS devices can be included in the integrated system 600, and each of these devices can comprise one or more deposited materials, one or more bonded materials, or others. Of course, there can be other variations, modifications, and alternatives.

In various embodiments, the overlying encapsulation layer 650 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 650 can be configured to hermetically seal any number of the integrated devices on the interface region 630. In various embodiments, encapsulation layer 150 can be used to form a first package. The first package can be electrically coupled to a processor, which can be electrically coupled to a memory and display. The processor can be configured to execute executable instructions from the memory, and the processor can be configured to receive signals from device 640, or other devices, in response to physical perturbations. Also, the processor can be configured to perform one or more tasks in response to the signals from device 640 and/or other devices. In a specific embodiment, the first package, the processor, the memory, and the display can be disposed into a physical case. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
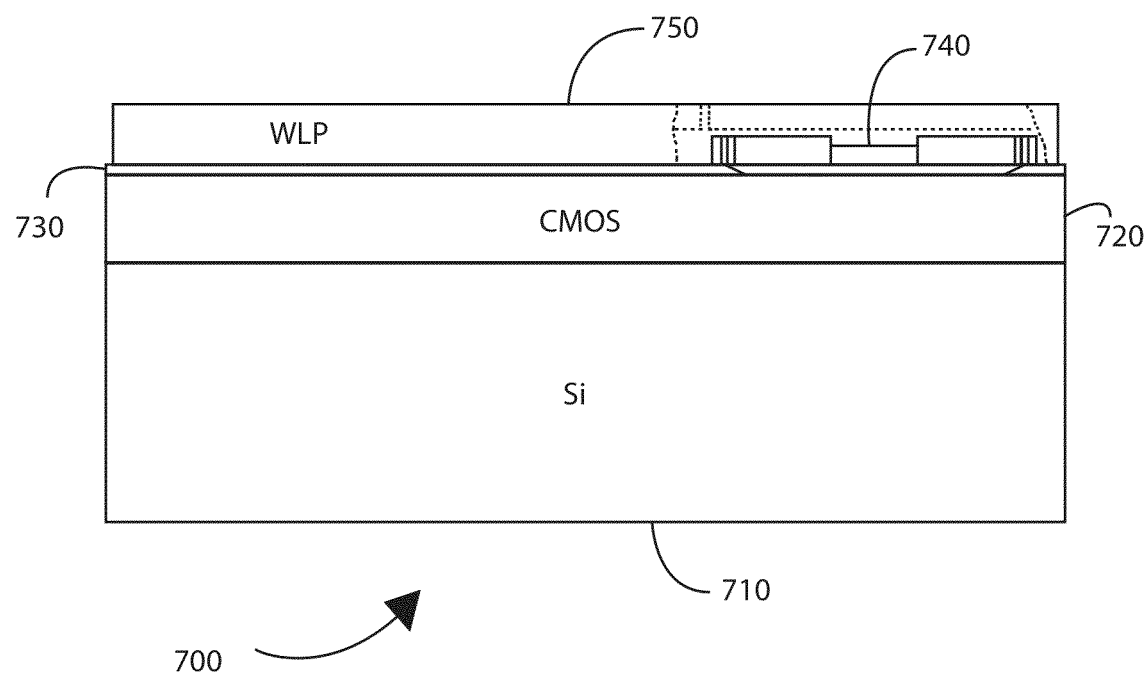
FIG. 7 is a simplified side diagram of an integrated multi-axial mechanical device and integrated circuit system according to an embodiment of the present invention.

FIG. 7 is a simplified side diagram of an integrated multiaxial mechanical device and integrated circuit system according to yet another embodiment of the present invention. This diagram is merely an example, which should not unduly limit the scope of the claims herein. One of ordinary skill in the art would recognize other variations, modifications, and alternatives. As shown, the system 700 includes a substrate layer 710, a semiconductor layer 720, an integrated device 740, and an encapsulation layer 750. The semiconductor layer 720 covers the substrate layer 510 while also creating a surface region that forms an interface region 730. In an embodiment, the common semiconductor layer 720 can be made of a silicon material or any other appropriate semiconductor. The semiconductor layer 720 can include a CMOS layer or any other appropriate layer for implementing microelectronics.

In various embodiments, the semiconductor layer 720 can include a CMOS layer comprised of any number of metal layers and can be provided on any type of design rule, such as a 0.18 micron design rule or less. Also, the interface region 730 formed by the semiconductor layer can be integrated with any number of MEMS devices and CMOS devices; the CMOS devices can be configured from a foundry compatible process. The CMOS and MEMS devices can all be configured individually in separate portions of the interface region 730. One skilled in the art would recognize other variations, modifications, and alternatives.

In a specific embodiment, the integrated device 740 can be a pressure sensor. In further embodiments, any number of MEMS devices can be included in the integrated system 700, and each of these devices can comprise one or more deposited materials, one or more bonded materials, or others. Of course, there can be other variations, modifications, and alternatives.

In various embodiments, the overlying encapsulation layer 750 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 750 can be configured to hermetically seal any number of the integrated devices on the interface region 730. In various embodiments, encapsulation layer 750 can be used to form a first package. The first package can be electrically coupled to a processor, which can be electrically coupled to a memory and display. The processor can be configured to execute executable instructions from the memory, and the processor can be configured to receive signals from device 740, or other devices, in response to physical perturbations. Also, the processor can be configured to perform one or more tasks in response to the signals from device 740 and/or other devices. In a specific embodiment, the first package, the processor, the memory, and the display can be disposed into a physical case. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
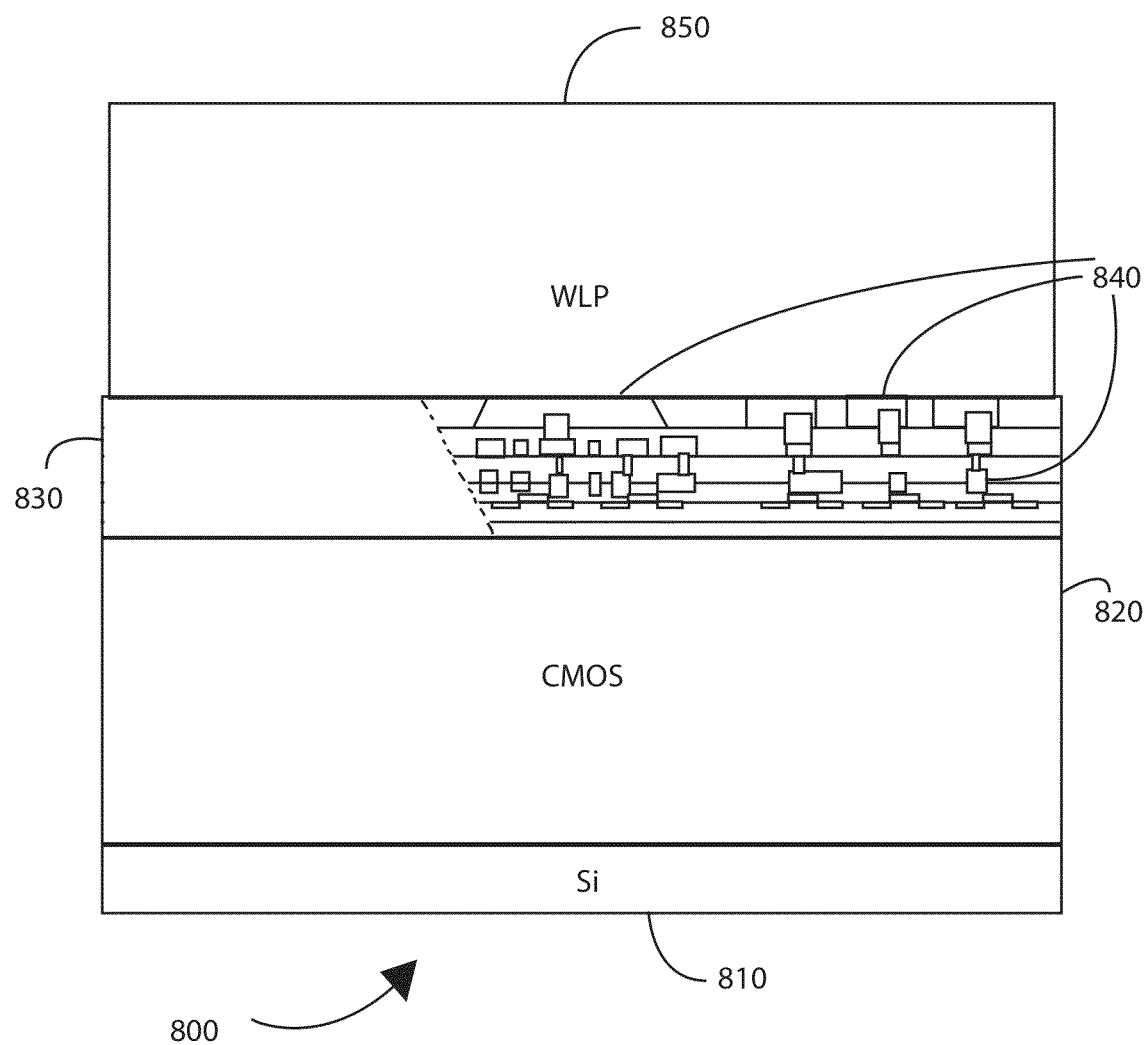
FIG. 8 is a simplified side diagram of an integrated multi-axial mechanical device and integrated circuit according to an embodiment of the present invention.

FIG. 8 is a simplified side diagram of an integrated multi-axial mechanical device and integrated circuit system according to yet another embodiment of the present invention. This diagram is merely an example, which should not unduly limit the scope of the claims herein. One of ordinary skill in the art would recognize other variations, modifications, and alternatives. As shown, the system 800 includes a substrate layer 810, a semiconductor layer 820, a CMOS device 840, and an encapsulation layer 850. The semiconductor layer 820 covers the substrate layer 810 while also creating a surface region that forms an interface region 830. In an embodiment, the common semiconductor layer 820 can be made of a silicon material or any other appropriate semiconductor. The semiconductor layer 820 can include a CMOS layer or any other appropriate layer for implementing microelectronics.

In various embodiments, the semiconductor layer 820 can include a CMOS layer comprised of any number of metal layers and can be provided on any type of design rule, such as a 0.18 micron design rule or less. The CMOS device 840 can be integrated into the CMOS layer 820 and configured with the interface region 830. Also, the CMOS device 840 can be configured from a foundry compatible process. Also, the interface region 830 formed by the semiconductor layer can be integrated with any number of MEMS devices and CMOS devices; the CMOS devices can be configured from a foundry compatible process. The CMOS and MEMS devices can all be configured individually in separate portions of the interface region 830. One skilled in the art would recognize other variations, modifications, and alternatives.

In various embodiments, the overlying encapsulation layer 850 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 850 can be configured to hermetically seal any number of the integrated devices on the interface region 830. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 9:
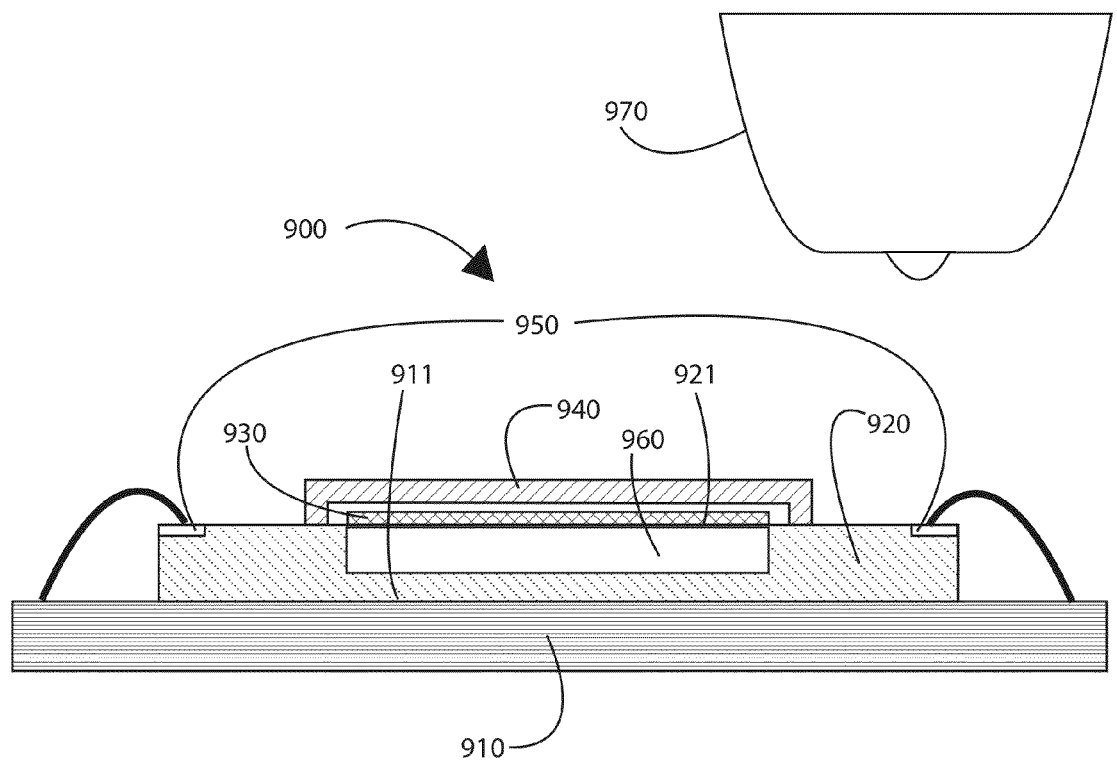
FIG. 9 is a simplified system diagram of an electronic packaging according to an embodiment of the prior art.

FIG. 9 is a simplified diagram of an electronic packaging according to an embodiment of the prior art. As shown, the apparatus 900 includes a substrate member 910, a semiconductor substrate 920, a MEMS device 930, an enclosure 940, and one or more bonding pads 950. The substrate member 910 has a surface region 911. The semiconductor substrate 920 comprises one or more integrated circuits 960. The semiconductor substrate 920 is bonded to a portion of the surface region 911 of the substrate member 910. The semiconductor substrate 920 has an upper surface region 921. The MEMS device 930 overlies an inner region of the upper surface region 921. The enclosure 940 houses the MEMS device 930 and overlies a first outer region of the upper surface region 921. The bonding pads 950 are configured on an outer region of the upper surface region 921 formed by the semiconductor substrate 920.

Figure 10:
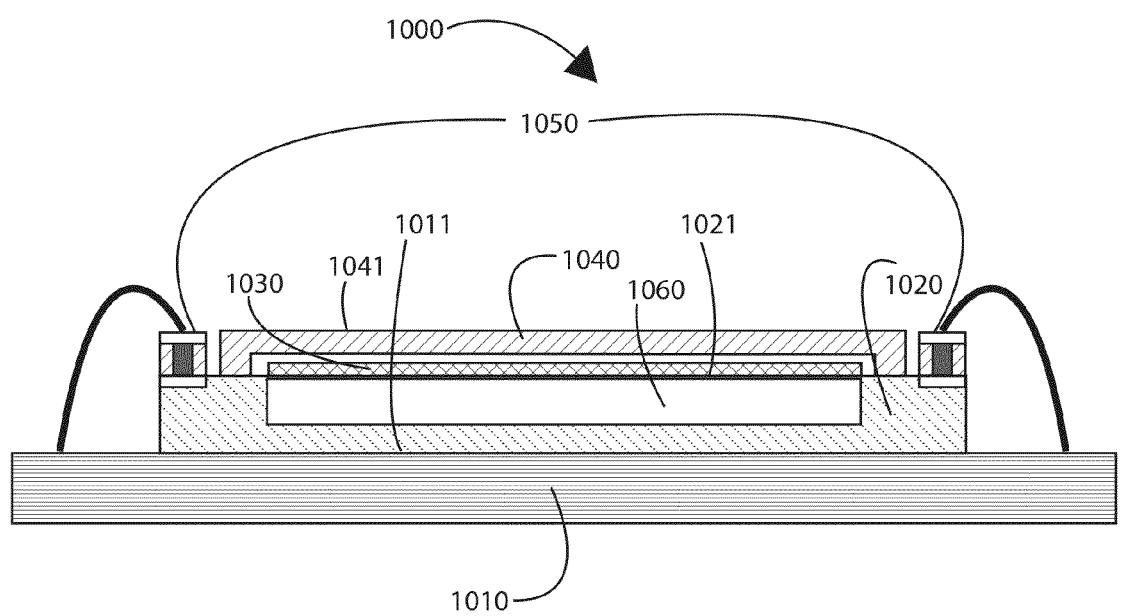
FIG. 10 is a simplified system diagram of an electronic packaging according to an embodiment of the present invention.
Figure 11:
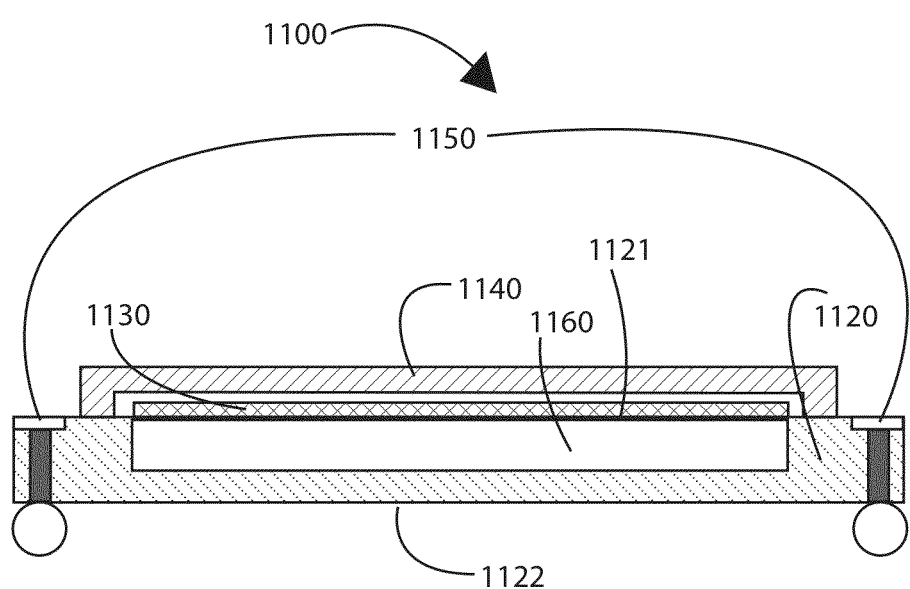
FIG. 11 is a simplified system diagram of an electronic packaging according to an embodiment of the present invention.
Figure 12:
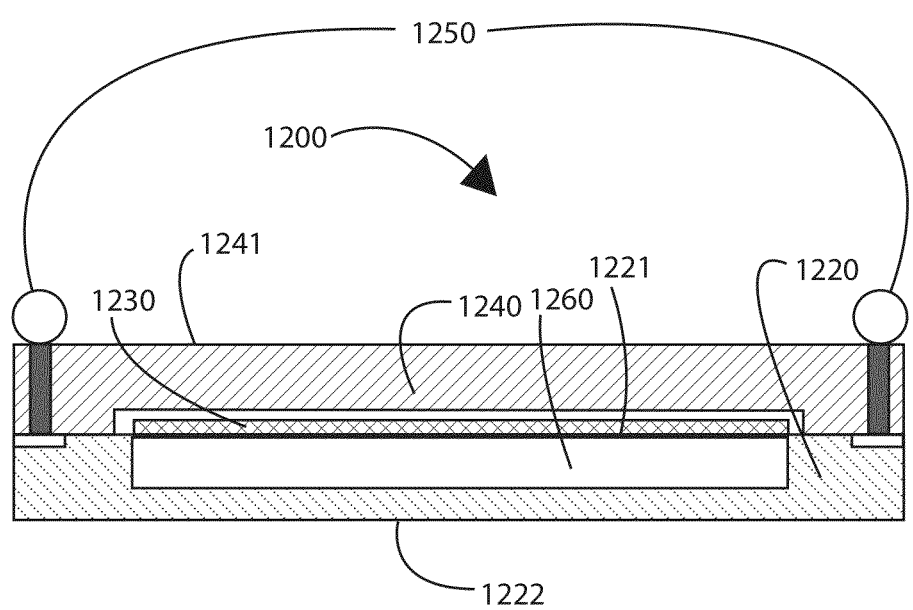
FIG. 12 is a simplified system diagram of an electronic packaging according to an embodiment of the present invention.

As shown, the apparatus 900 presents a considerable problem for the traditional ball bonding process. Ball bonding is a common type of wire bonding used to make electrical connections as part of semiconductor device fabrication. The ball bonding process uses a capillary 970 to attach a wire to the bonding pads 950. However, the capillary 950 cannot reach the bonding pads 950 because it is obstructed by the enclosure 940. The following FIGS. 10-12 present novel configurations of apparatus types for packaging MEMS and ICs. Further details regarding these apparatus types are provided below.

FIG. 10 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 1000 includes a substrate member 1010, a semiconductor substrate 1020, one or more MEMS devices 1030, an enclosure 1040, and one or more bonding structures 1050. The substrate member 1010 can have a surface region 1011. In an embodiment, the substrate 1010 can be a semiconductor, metal, a dielectric, or any other material type. Also, the substrate 1010 can comprise a PCB, a lead frame, a silicon material, or others. In a specific embodiment, the semiconductor substrate 1020 can comprise one or more integrated circuits 1060. Also, the semiconductor substrate 1020 can be bonded to a portion of the surface region 1011 of the substrate member 1010. The semiconductor substrate 1020 can have an upper surface region 1021. In a specific embodiment, the semiconductor substrate 1020 is characterized by a thickness of about 600 to about 800 microns. There can be other variations, modifications, and alternatives to the substrates described herein.

In an embodiment, the one or more MEMS devices 1030 overlie an inner region of the upper surface region 1021 formed by the semiconductor substrate 1020. The one or more MEMS devices 1030 can be selected from an accelerometer, a gyroscope, a magnetic field sensor, a pressure sensor, a microphone, a humidity sensor, a temperature sensor, a chemical sensor, a biosensor, an inertial sensor, or others. In an embodiment, the upper surface region 1021 formed by the semiconductor substrate 1020 can comprise a dielectric material, and others. Also, the upper surface region 1021 can comprise an inner region, a first outer region, and a second outer region. In an embodiment, the first outer region and second outer region is characterized by a width of about 200 microns or less and 100 microns or less, respectively. In a specific embodiment, the enclosure 1040 can house the one or more MEMS devices 1030. The enclosure 1040 can overlie the first outer region of the upper surface region 1021. Also, the enclosure 1040 can have an upper cover region 1041. In an embodiment, an opening can be provided between the enclosure 1040 and the one or more MEMS devices 1030. In another embodiment, the opening can be filled with one or more gasses. Of course, there can be other variations, modifications, and alternatives.

In a specific embodiment, the one or more bonding structures 1050 can each have a bonding pad within a vicinity of the upper cover region 1041 formed by the enclosure 1040. The one or more bonding structures 1050 can also be provided within a second outer region of the upper surface region 1021. In a specific embodiment, each of the bonding structures 1050 can comprise a bonding pad, a via structure, and a pad structure. The pad structure can be integrally coupled to the one or more integrated circuits 1060. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIG. 11 is a simplified diagram of an electronic packaging according to another embodiment of the present invention. This diagram is merely an example, which should not unduly limit the scope of the claims herein. One of ordinary skill in the art would recognize other variations, modifications, and alternatives. As shown, the apparatus 1100 includes a semiconductor substrate 1120, one or more MEMS devices 1130, an enclosure 1140, and one or more bonding structures 1150. In a specific embodiment, the semiconductor substrate 1120 can comprise one or more integrated circuits 1160. The semiconductor substrate 1120 can have a surface region 1121 and a backside region 1122. The surface region 1121 can comprise an inner region, a first outer region, and a second outer region. In a specific embodiment, the semiconductor substrate 1120 is characterized by a thickness of about 600 to about 800 microns. Additionally, the surface region 1121 can comprise a dielectric material, and others. There can be other variations, modifications, and alternatives to the substrates described herein.

In an embodiment, the one or more MEMS devices 1130 overlie an inner region of the surface region 1121 formed by the semiconductor substrate 1120. The one or more MEMS devices 1130 can be selected from an accelerometer, a gyroscope, a magnetic field sensor, a pressure sensor, a microphone, a humidity sensor, a temperature sensor, a chemical sensor, a biosensor, an inertial sensor, or others. In an embodiment, the surface region 1121 formed by the semiconductor substrate 1120 can comprise a dielectric material, and others. Also, the surface region 1121 can comprise an inner region, a first outer region, and a second outer region. In an embodiment, the first outer region and second outer region is characterized by a width of about 200 microns or less and 100 microns or less, respectively. In a specific embodiment, the enclosure 340 can house the one or more MEMS devices 330. The enclosure 1140 can overlie the first outer region of the surface region 1121. In an embodiment, an opening can be provided between the enclosure 1140 and the one or more MEMS devices 1130. In another embodiment, the opening can be filled with one or more gasses. Of course, there can be other variations, modifications, and alternatives.

In a specific embodiment, the one or more bonding structures 1150 can be provided through a thickness of the semiconductor substrate 1120. The one or more bonding structures 1150 can also be configured to overlie the second outer region of the surface region 1121. In a specific embodiment, each of the bonding structures 1150 can comprise a bonding pad, a via structure, and a pad structure. The bonding pad can be provided within a vicinity of the first outer region, and the second bonding pad can be provided within a portion of the backside region 1122. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIG. 12 is a simplified diagram of an electronic packaging according to yet another embodiment of the present invention. This diagram is merely an example, which should not unduly limit the scope of the claims herein. One of ordinary skill in the art would recognize other variations, modifications, and alternatives. As shown, the apparatus 1200 includes a semiconductor substrate 1220, one or more MEMS devices 1230, an enclosure 1240, and one or more bonding structures 1250. In a specific embodiment, the semiconductor substrate 1220 can comprise one or more integrated circuits 1260. The semiconductor substrate 1220 can have a surface region 1221 and a backside region 1222. The surface region 1221 can comprise an inner region and a first outer region. In a specific embodiment, the semiconductor substrate 1220 is characterized by a thickness of about 600 to about 800 microns. Additionally, the surface region 1221 can comprise a dielectric material, and others. There can be other variations, modifications, and alternatives to the substrates described herein.

In an embodiment, the one or more MEMS devices 1230 overlie an inner region of the surface region 1221 formed by the semiconductor substrate 1220. The one or more MEMS devices 1230 can be selected from an accelerometer, a gyroscope, a magnetic field sensor, a pressure sensor, a microphone, a humidity sensor, a temperature sensor, a chemical sensor, a biosensor, an inertial sensor, or others. In an embodiment, the surface region 1221 formed by the semiconductor substrate 1220 can comprise a dielectric material, and others. Also, the surface region 1221 can comprise an inner region, a first outer region, and a second outer region. In an embodiment, the first outer region and second outer region is characterized by a width of about 200 microns or less and 100 microns or less, respectively. In a specific embodiment, the enclosure 1240 can house the one or more MEMS devices 1230. The enclosure 1240 can overlie the first outer region of the surface region 1221. Also, the enclosure can have an upper cover region 1241. In an embodiment, an opening can be provided between the enclosure 1240 and the one or more MEMS devices 1230. In another embodiment, the opening can be filled with one or more gasses. Of course, there can be other variations, modifications, and alternatives.

In a specific embodiment, the one or more bonding structures 1250 can be provided through a thickness of the semiconductor substrate 1220. The one or more bonding structures 1250 can also be configured to overlie the first outer region of the surface region 1221. In a specific embodiment, each of the bonding structures 1250 can comprise a bonding pad, a via structure, and a pad structure. The bonding pad can be provided within a vicinity of the first outer region, and the second bonding pad can be provided within a portion of the upper cover region 1241. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 13:
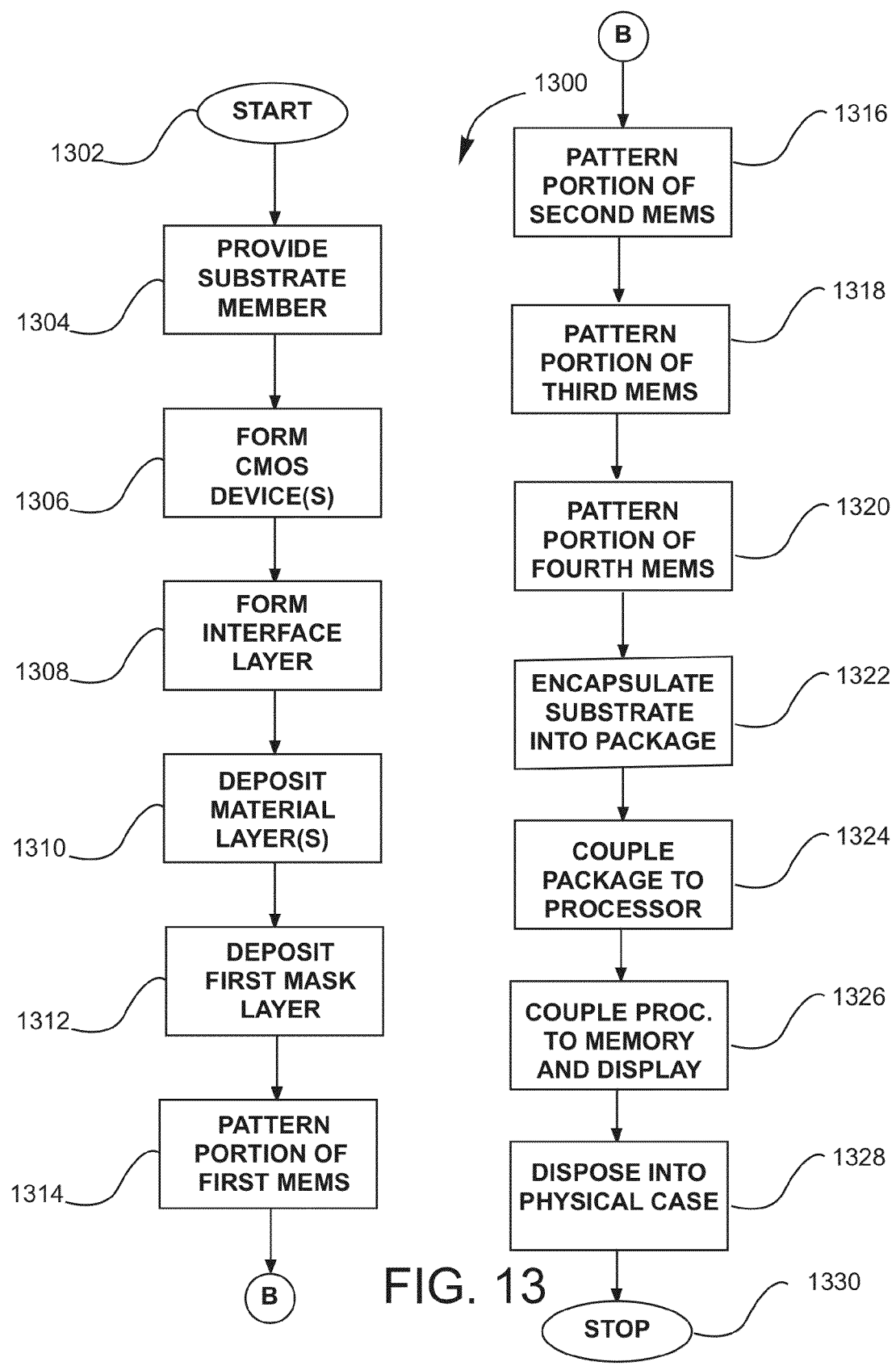
FIG. 13 is a simplified flow diagram of a method of fabricating an integrated multi-axis mechanical device and integrated circuit system according to an embodiment of the present invention.

FIG. 13 is a simplified flow diagram of a method of fabricating an integrated multi-axis mechanical device and integrated circuit system according to an embodiment of the present invention. These diagrams are merely examples, which should not unduly limit the scope of the claims herein. One of ordinary skill in the art would recognize other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 13, the present method can be briefly outline below.

1. Start;
2. Provide a substrate member;
3. Form one or more CMOS devices;
4. Form an interface layer overlying the one or more CMOS devices;
5. Deposit one or more material layers overlying the interface layer;
6. Deposit a first mask layer above the material layer(s);
7. Patterning a portion of at least one first MEMS sensor using the first mask layer;
8. Patterning a portion of at least one second MEMS sensor using the first mask layer;
9. Patterning a portion of at least one third MEMS sensor using the first mask layer;
10. Patterning a portion of at least one fourth MEMS sensor using the first mask layer;
11. Encapsulating the substrate into a first package;
12. Electrically coupling the first package to a processor;
13. Electrically coupling the processor to a memory and a display;
14. Disposing the first package, the processor, the memory, and the display into a physical case; and
15. Stop.

These steps are merely examples and should not unduly limit the scope of the claims herein. As shown, the above method provides a way of operating an integrated SOC implementing a sensor processor coupled to one or more MEMS devices. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 13, the method 1300 begins at start, step 1302. After receiving a substrate member, step 1304, one or more CMOS devices can be formed overlying the substrate member, step 1306. The substrate can include a silicon substrate, substrate-on-insulator (SOI), glass substrate, or other substrate. In various embodiments, the one or more CMOS devices can include a CMOS layer comprised of any number of metal layers and can be provided on any type of design rule, such as a 0.18 micron design rule (or 0.11 micron or 90 nm or 70 nm or 55 nm) or less. One skilled in the art would recognize other variations, modifications, and alternatives.

An interface layer can then be formed on top of the one or more CMOS devices, step 1308. The interface layer can include one or more silicon materials, dielectric materials, or metal materials, or other materials and combinations thereof. Of course, there can be other variations, modifications, and alternatives. One or more material layers can be deposited above the interface layer, step 1310. The one or more material layers can also include one or more silicon materials, dielectric materials, or metal materials, or other materials and combinations thereof. Also, the interface layer can be integrated with any number of the one or more CMOS devices, which can be configured from a foundry compatible process, such as those of semiconductor foundry operations of Taiwan Semiconductor Manufacturing Corporation, and others. In a specific embodiment, the material layer(s) can be processed to form a processed layer. A mask layer can be disposed above the one or more material layers, step 1312. Those of ordinary skill in the art will recognize other variations, modifications, and alternatives.

A portion of one or more MEMS devices can be patterned using the first mask layer. More particularly, a portion of at least one first, second, third, and fourth MEMS device can be patterned using the first mask layer, steps 1314, 1316, 1318, and 1320. The one or more devices can form a multi-axis integrated mechanical system. The one or more devices, and possibly additional devices, can all be configured individually in separate portions of the interface layer. In further embodiments, the MEMS devices, and additional devices, can comprise an upper surface region that faces away from the CMOS device(s). In various embodiments, the devices can be selected from a group consisting of: an accelerometer, a gyroscope, magnetic field sensor, a pressure sensor, a microphone, a humidity sensor, a temperature sensor, a chemical sensor, a biosensor, an inertial sensor. Of course, there can be variations, modifications, and alternatives.

In specific embodiment, the first, second, third, and fourth MEMS devices can include a gyroscope device, an accelerometer device, a magnetic field sensing device, a pressure sensor device. In an embodiment, the magnetic sensing device can include a first axis sensing device, a second axis sensing device, and a third axis sensing device. In various embodiments, the first axis of the sensing device can represent an x-axis, the second axis can represent a y-axis, and the third can represent a z-axis. In various embodiments, the gyroscope device can include a first axis gyroscope device, a second axis gyroscope device, and a third axis gyroscope device. In a specific embodiment, the first axis of the gyroscope device can represent an x-axis, the second axis can represent a y-axis, and the third can represent a z-axis. The accelerometer device can include a first and second axis accelerometer device, and a third axis accelerometer device. The third axis of the accelerometer device can represent the z-axis, and the first and second axis can represent axes in the x and y direction, respectively. Also, the pressure sensor device can be configured to detect a force in at least a first direction. One of ordinary skill in the art will recognize other modifications, variations, and alternatives.

These mechanical devices can be integrated with the interface region overlying the one or more CMOS devices on top of the substrate member. In a specific embodiment, the MEMS devices can be formed from a common material layer, a common processed material layer, mask layer, or other layers or combinations thereof. In various embodiments, the MEMS devices can configured in an array within a vicinity of each other to reduce parasitics. Again, there can be other variations, modifications, and alternatives.

The substrate can encapsulated into a first package, step 1322. In various embodiments, the overlying encapsulation layer can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer can be configured to hermetically seal any number of the integrated devices on the interface layer. In various embodiments, encapsulation layer can be used to form a first package. The first package can be electrically coupled to a processor, step 1324, which can be electrically coupled to a memory and display, step 1326. The processor can be configured to execute executable instructions from the memory, and the processor can be configured to receive signals from the MEMS devices, or other devices, in response to physical perturbations. Also, the processor can be configured to perform one or more tasks in response to the signals from MEMS devices and/or other devices. In a specific embodiment, the first package, the processor, the memory, and the display can be disposed into a physical case, step 1328. Again, there can be many other variations, modifications, and alternatives.

The present technique provides an easy to use process that relies upon conventional technology. This technique can reduce off-chip connections, which makes the mass production of smaller and thinner units possible. Also, integrated CMOS-MEMS technology can achieve high accuracy through the minimization of parasitic resistances and capacitances due to joint fabrication. In some embodiments, the method provides higher device yields in dies per wafer with the integrated approach. Additionally, the method provides a process and system that are compatible with conventional process technology without substantial modifications to conventional equipment and processes.

The above sequence of steps provides a method of fabricating an integrated mechanical device and circuit system according to an embodiment of the present invention. The method includes receiving a substrate, forming an interface layer, forming one or more material layers, forming a mask layer, forming at least four different types of MEMS devices, packaging the device, and coupling the device to a processor, memory, and display within a case. Other alternatives can also be provided where steps are added, one or more steps are removed, or one or more steps are provided in a different sequence without departing from the scope of the claims herein. Further details of the present method can be found throughout the present specification.

Figure 14:
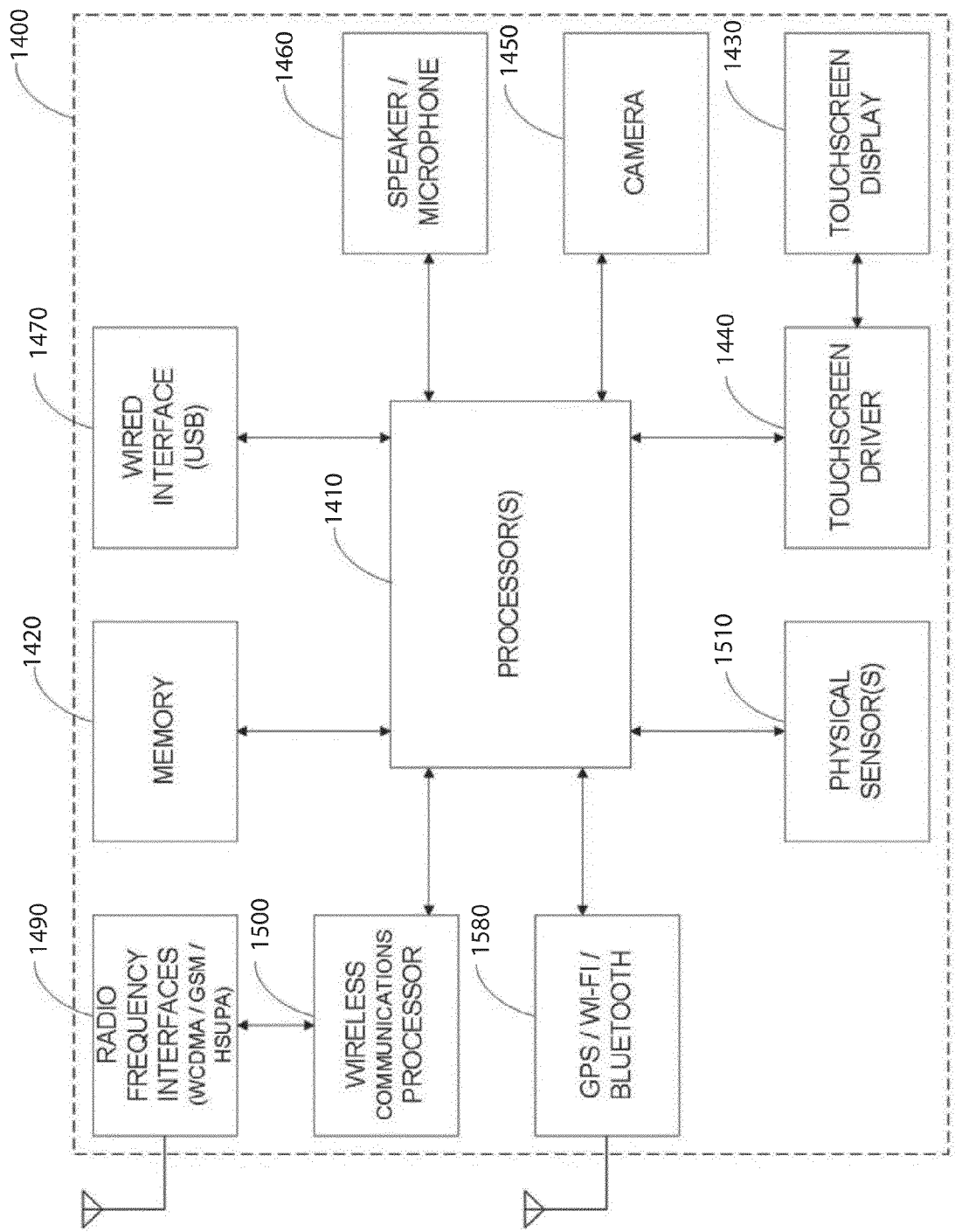
FIG. 14 is a simplified block diagram of a device incorporating various embodiments of the present invention.

FIG. 14 illustrates a functional block diagram of various embodiments of the present invention. In FIG. 14, a computing device 1400 typically includes an applications processor 1410, memory 1420, a touch screen display 1430 and driver 1440, an image acquisition device 1450, audio input/output devices 1460, and the like. Additional communications from and to computing device are typically provided by via a wired interface 1470, a GPS/Wi-Fi/Bluetooth interface 1480, RF interfaces 1490 and driver 1500, and the like. Also included in various embodiments are physical sensors 1510.

In various embodiments, computing device 1400 may be a hand-held computing device (e.g. Apple iPad, Apple iTouch, Dell Mini slate/Streak, Lenovo Skylight/IdeaPad, Samsung Galaxy Tab, Asus EEE series, HP Slate, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1400 may include one or more processors 1410. Such processors 1410 may also be termed application processors, and may include a processor core, a video/graphics core, and other cores. Processors 1410 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1420 may include different types of memory (including memory controllers), such as flash memory (e.g. NOR, NAND), pseudo SRAM, DDR SDRAM, or the like. Memory 1420 may be fixed within computing device 1400 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1430 and driver 1440 may be based upon a variety of later-developed or current touch screen technology including resistive displays, capacitive displays, optical sensor displays, electromagnetic resonance, or the like. Additionally, touch screen display 1430 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1450 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1460 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1410 to enable the user to operate computing device 1400 by stating voice commands. Additionally, a speech engine may be provided in various embodiments to enable computing device 1400 to provide audio status messages, audio response messages, or the like.

In various embodiments, wired interface 1470 may be used to provide data transfers between computing device 1400 and an external source, such as a computer, a remote server, a storage network, another computing device 1400, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1480 may also be provided to provide wireless data transfers between computing device 1400 and external sources, such as computers, storage networks, headphones, microphones, cameras, or the like. As illustrated in FIG. 14, wireless protocols may include Wi-Fi (e.g. IEEE 802.11 a/b/g/n, WiMax), Bluetooth, IR and the like.

GPS receiving capability may also be included in various embodiments of the present invention, however is not required. As illustrated in FIG. 14, GPS functionality is included as part of wireless interface 1480 merely for sake of convenience, although in implementation, such functionality is currently performed by circuitry that is distinct from the Wi-Fi circuitry and distinct from the Bluetooth circuitry.

Additional wireless communications may be provided via RF interfaces 1490 and drivers 1500 in various embodiments. In various embodiments, RF interfaces 1490 may support any future-developed or conventional radio frequency communications protocol, such as CDMA-based protocols (e.g. WCDMA), GSM-based protocols, HSUPA-based protocols, or the like. In the embodiments illustrated, driver 1500 is illustrated as being distinct from applications processor 1410. However, in some embodiments, these functionality are provided upon a single IC package, for example the Marvel PXA330 processor, and the like. It is contemplated that some embodiments of computing device 1400 need not include the RF functionality provided by RF interface 1490 and driver 1500.

FIG. 14 also illustrates computing device 1400 to include physical sensors 1510. In various embodiments of the present invention, physical sensors 1510 can be single axis or multi-axis Micro-Electro-Mechanical Systems (MEMS) based devices being developed by M-cube, the assignee of the present patent application. Physical sensors 1510 can include accelerometers, gyroscopes, pressure sensors, magnetic field sensors, bio sensors, and the like. In various embodiments, physical sensors 1510 may fabricated using the combined CMOS MEMS fabrication techniques described above. More specifically, one or more MEMS devices may be fabricated approximately in parallel using common masks, layers, and processes, above a substrate. In various embodiments, the substrate may be on top of a CMOS device. Both the CMOS and MEMS device may be fabricated using foundry-compatible processes. In other embodiments of the present invention, conventional physical sensors 1510 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1430 and driver 1440 and inputs/or outputs to physical sensors 1510 may be processed in parallel processing threads. In other embodiments, such events or outputs may be processed serially, or the like. Inputs and outputs from other functional blocks may also be processed in parallel or serially, in other embodiments of the present invention, such as image acquisition device 1450 and physical sensors 1510.

FIG. 14 is representative of one computing device 1400 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 14. For example, in various embodiments, computing device 1400 may lack image acquisition unit 1450, or RF interface 1490 and/or driver 1500, or GPS capability, or the like. Additional functions may also be added to various embodiments of computing device 1400, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. A method for fabricating an integrated multi-axis mechanical device and integrated circuit system comprising:
    providing a substrate member;
    forming one or more CMOS devices upon the substrate member;
    forming an interface layer on top of the one or more CMOS devices; and
    forming at least four different MEMS physical sensors upon the interface layer using a foundry compatible process; wherein forming the at least four different MEMS physical sensors comprises at least:
        forming a gyroscope device comprising at least a first gyro axis, a second gyro axis, and a third gyro axis;
        forming an accelerometer device comprising at least a first accel axis, a second accel axis, and a third accel axis;
        forming a magnetic field sensing device comprising at least a first mag axis, a second mag axis, and a third mag axis; and
        forming a pressure sensor device configured to detect a force in at least a direction; and
    forming one or more bonding structures provided through a thickness of the substrate member, each of the bonding structures comprising a bonding pad, a via structure, and a pad structure.

2. The method of claim 1 wherein forming at least four MEMS physical sensors comprises:
    depositing a first material layer above the interface layer;
    forming the gyroscope device using the first material layer;
    forming accelerometer device using the first material layer;
    forming the magnetic field sensing device using the first material layer; and
    forming the pressure sensor device using the first material layer.

3. The method of claim 1 wherein forming one or more MEMS physical sensors comprises:
    depositing one or more material layers above the interface layer;

disposing a first mask layer above the one or more material layers;

patterning a portion of the gyroscope device using the first mask layer;

patterning a portion of the accelerometer device using the first mask layer;

patterning a portion of the magnetic field sensing device using the first mask layer; and patterning a portion of the pressure sensor device using the first mask layer.

4. The method of claim 1 wherein forming one or more MEMS physical sensors comprises:

processing one or more material layers above the interface layer to form a processed layer;

forming the gyroscope device using the processed layer;

forming the accelerometer device using the processed layer;

forming the magnetic field sensing device using the processed layer; and forming the pressure sensor device using the processed layer.

5. The method of claim 1 further comprising encapsulating the substrate member into a first package.

6. The method of claim 5 further comprising:

electrically coupling the first package to a processor;

electrically coupling the processor to a memory and a display; and disposing the first package, the processor, the memory, and the display into a physical case.

* * * * *